(12) United States Patent
Muhr et al.

(10) Patent No.: US 11,309,196 B2
(45) Date of Patent: Apr. 19, 2022

(54) DETECTION OF ADHESIVE RESIDUE ON A WAFER

(71) Applicant: Infineon Technologies AG, Neubiberg (DE)

(72) Inventors: Robert Muhr, Villach (AT); Matthias Fehr, Dresden (DE); Walter Leitgeb, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/588,433

(22) Filed: Sep. 30, 2019

(65) Prior Publication Data

US 2020/0105552 A1    Apr. 2, 2020

(30) Foreign Application Priority Data

Oct. 1, 2018  (EP) .................................... 18197928

(51) Int. Cl.

| | |
|---|---|
| *H01L 21/67* | (2006.01) |
| *G06T 7/00* | (2017.01) |
| *H01L 21/683* | (2006.01) |
| *H04N 5/235* | (2006.01) |
| *H04N 5/247* | (2006.01) |

(52) U.S. Cl.

CPC ...... *H01L 21/67132* (2013.01); *G06T 7/0004* (2013.01); *H01L 21/67282* (2013.01); *H01L 21/6836* (2013.01); *H04N 5/2354* (2013.01); *H04N 5/247* (2013.01); *G06T 2207/10048* (2013.01); *G06T 2207/10064* (2013.01); *G06T 2207/30148* (2013.01); *H01L 2221/68386* (2013.01)

(58) Field of Classification Search

CPC ........ H01L 21/67132; H01L 21/67282; H01L 21/6836; H01L 2221/68386; H01L 2221/68318; H01L 2221/68327; H01L 2221/6834; H01L 2221/68381; H01L 2221/6839; H01L 21/6835; H01L 21/67115; H01L 21/67253; H01L 22/12; G06T 7/0004; G06T 2207/10048; G06T 2207/10064; G06T 2207/30148; H04N 5/2354; H04N 5/247

See application file for complete search history.

(56) References Cited

U.S. PATENT DOCUMENTS

| | | |
|---|---|---|
| 2006/0219359 A1 | 10/2006 | Miyamoto et al. |
| 2010/0105022 A1 | 4/2010 | Kuiper et al. |
| 2011/0290415 A1* | 12/2011 | George ............ H01L 21/67132 156/247 |

(Continued)

FOREIGN PATENT DOCUMENTS

WO    2013136188 A1    9/2013

*Primary Examiner* — Joseph W Becker
(74) *Attorney, Agent, or Firm* — Murphy, Bilak & Homiller, PLLC (57) ABSTRACT

A method of detecting adhesive residue on a wafer after peeling an adhesive film from the wafer by using a peeling tape is described. According to a first aspect, the method includes illuminating the peeling tape with first UV light after the peeling and acquiring a fluorescence image from the peeling tape. According to a second aspect, the method includes illuminating the wafer with second UV light after the peeling and acquiring a fluorescence image from the wafer.

19 Claims, 8 Drawing Sheets

(56) References Cited

U.S. PATENT DOCUMENTS

| | | | |
|---|---|---|---|
| 2015/0001087 A1* | 1/2015 | Dinneen | C25D 21/10 |
| | | | 205/81 |
| 2017/0040201 A1* | 2/2017 | Nakamura | H01L 22/12 |
| 2017/0176331 A1* | 6/2017 | Ryo | G01N 21/8422 |
| 2018/0144983 A1* | 5/2018 | Shigematsu | H01L 21/6836 |
| 2018/0277401 A1* | 9/2018 | Watanabe | B24B 9/065 |

\* cited by examiner

DETECTION OF ADHESIVE RESIDUE ON A WAFER

TECHNICAL FIELD

The disclosure relates to the field of wafer processing and in particular to a detection of adhesive residue on a wafer.

BACKGROUND

During wafer processing such as, e.g., wafer thinning and/or wafer backside processing wafers are temporarily bonded to a carrier. Several technologies are available for demounting the wafer from the carrier after processing. If the wafer is bonded by an adhesive to the carrier, the demounting process may include detaching the carrier from the wafer and then removing the adhesive film (which is still on the wafer after the detaching process) from the wafer.

In order to remove the adhesive film from the wafer, a peeling tape may be applied on the adhesive film. The peeling tape is then peeled in order to remove the adhesive film from the wafer. However, it may happen that the peeling tape does not completely remove the adhesive film from the wafer. In this circumstance adhesive residues will remain on the wafer. Such adhesive residues can cause problems during subsequent wafer processing or wafer handling. Further, wafers with adhesive residues must not be delivered to customers. Hence, there is a demand to perform an inspection in order to detect adhesive residues on the wafer.

SUMMARY

A method of detecting adhesive residue on a wafer after peeling an adhesive film from the wafer by using a peeling tape is described. The method may include illuminating the peeling tape with first UV (ultraviolet) light after peeling and acquiring a fluorescence image from the peeling tape. Alternatively or additionally, the method may include illuminating the wafer with second UV light after peeling and acquiring a fluorescence image from the wafer.

Fluorescence imaging of the peeling tape and/or of the wafer may have the advantage to provide for an enhanced detectability of adhesive residue on the wafer compared to conventional light imaging methods.

A detection arrangement for detecting adhesive residue on a wafer after peeling an adhesive film from the wafer by using a peeling tape may include a first UV light source configured to illuminate the peeling tape with first UV light after peeling and a first camera configured to acquire a fluorescence image from the peeling tape. Alternatively or additionally, the detection arrangement may include a second UV light source configured to illuminate the wafer with second UV light after peeling and a second camera configured to acquire a fluorescence image from the wafer.

DETAILED DESCRIPTION

Figure 1:
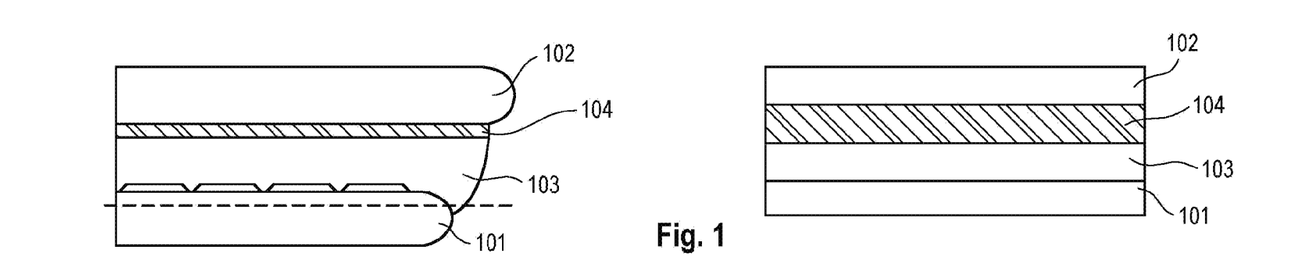
FIG. 1 is an exemplary sectional view of a wafer mounted on a carrier and an exemplary schematic representation of the respective layer composition.

FIG. 1 illustrates a wafer 101 temporarily bonded to a carrier 102. The carrier 102 may be used as a support of the wafer 101 during wafer processing such as, e.g., wafer thinning and/or subsequent wafer backside processing.

Several different technologies are available for bonding and de-bonding the wafer 101 to the carrier 102. For example, the wafer 101 may be glued to the carrier 102 by using an adhesive film 103. The adhesive film 103 itself or a release layer 104 arranged between the adhesive film 103 and the carrier 102 may be made of a material configured to decompose and/or lose its adhesive strength upon application of external energy. That is, such layer(s) 103, 104 allow to mount and demount (upon application of external energy) the wafer 101 from the carrier 102.

By way of example, the release layer 104 may be a so-called light to heat conversion (LTHC) layer. The adhesive film 103 may, e.g., be an ultraviolet (UV) curable adhesive. The carrier 102 may be a transparent carrier, e.g. a glass carrier.

For mounting the wafer 101 on the carrier 102, the carrier 102 may be coated with the release layer material and a liquid adhesive material may be applied to the wafer 101 to form the adhesive film 103. The wafer 101 with the adhesive film 103 is then mounted onto the carrier 102 coated with the release layer 104. In order to create a bond, the adhesive material of the adhesive film 103 may be cured by using, e.g., UV light. FIG. 1 illustrates a partial side view (left portion of FIG. 1) of the mounted wafer 101 and a schematic representation of the respective layer composition (right portion of FIG. 1).

Figure 2:
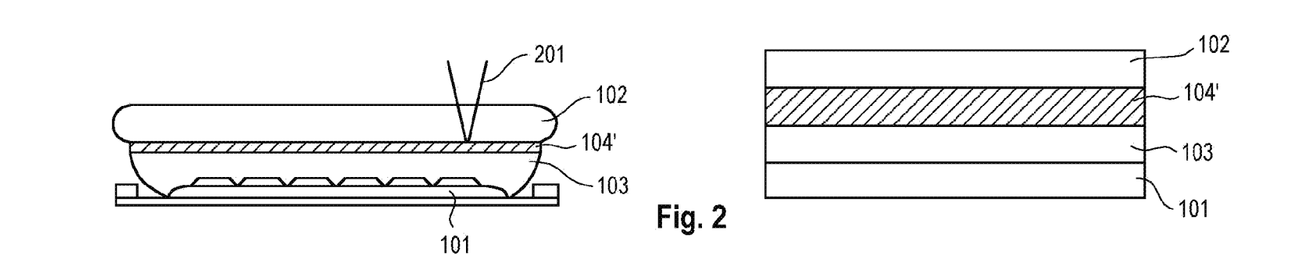
FIG. 2 is an exemplary sectional view of the wafer mounted on the carrier during and after application of release energy and an exemplary schematic representation of the respective layer composition.
Figure 3:
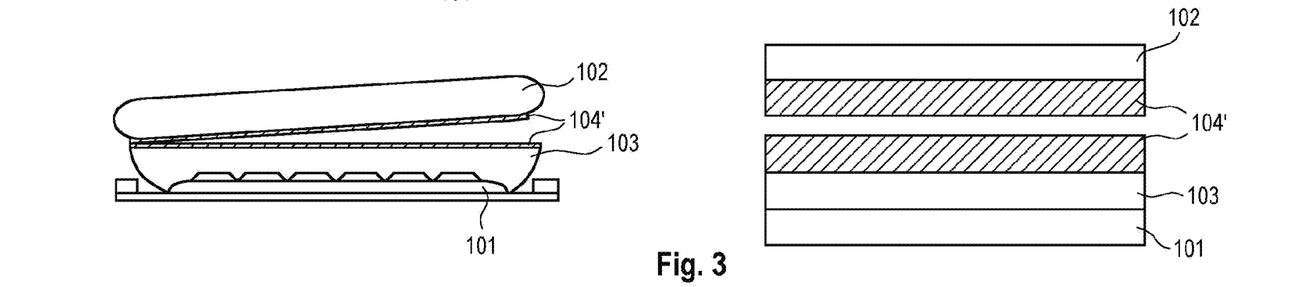
FIG. 3 is an exemplary sectional view of the carrier detached from the wafer and an exemplary schematic representation of the respective layer composition.

Removal of the carrier 102 from the wafer 101 may be done by a process which is illustrated in FIGS. 2 and 3. External energy (such as, e.g., laser irradiation) may be applied to the layer(s) 103, 104, which are configured to adhere the wafer 101 to the carrier 102. By way of example, if an adhesive film 103 and a release layer 104 are used, the energy may be applied to the release layer 104 in order to decompose or otherwise reduce the adhesive strength of the release layer 104. For example, laser light may be irradiated with a focused laser beam 201 through the transparent carrier 102 along a raster. The release layer 104 may absorb the laser light of the laser beam 201 to generate heat to decompose the release layer 104. The decomposed (or otherwise impacted) release layer 104 is denoted by reference sign 104' in FIG. 2.

The decomposition of the release layer 104 allows to detach the carrier 102 from the wafer 101 (which is shown to be placed on a support in the left portions of FIGS. 2 to 5). The detaching process is shown in FIG. 3. After detaching the carrier 102 the adhesive film 103 is still disposed on the wafer 101. Further, the decomposed or impacted release layer 104' may partly or completely remain attached to the adhesive film 103.

Figure 4:
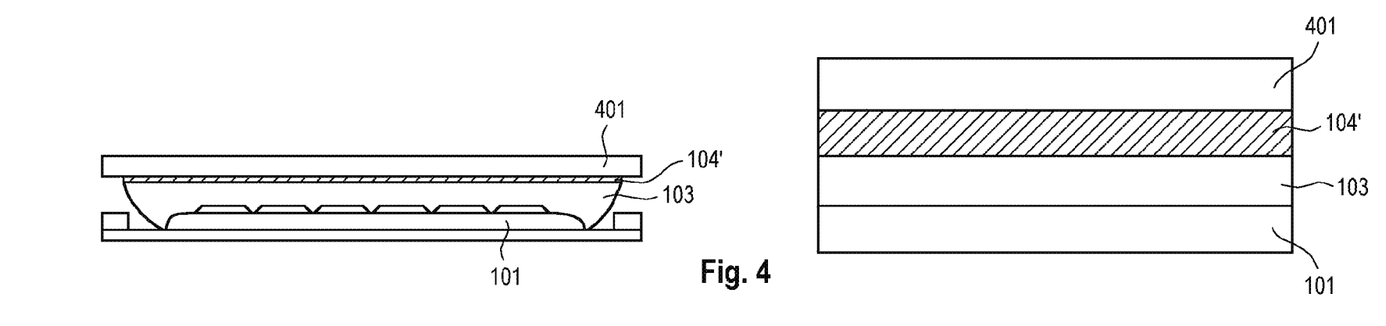
FIG. 4 is an exemplary sectional view of the wafer and a peeling tape attached to the wafer and an exemplary schematic representation of the respective layer composition.

In order to remove the adhesive film 103 and, e.g., the decomposed release layer 104' from the wafer 101, a peeling tape 401 is applied to the adhesive film 103, see FIG. 4. A rolling process may be used for the application of the peeling tape 401.

Figure 5:
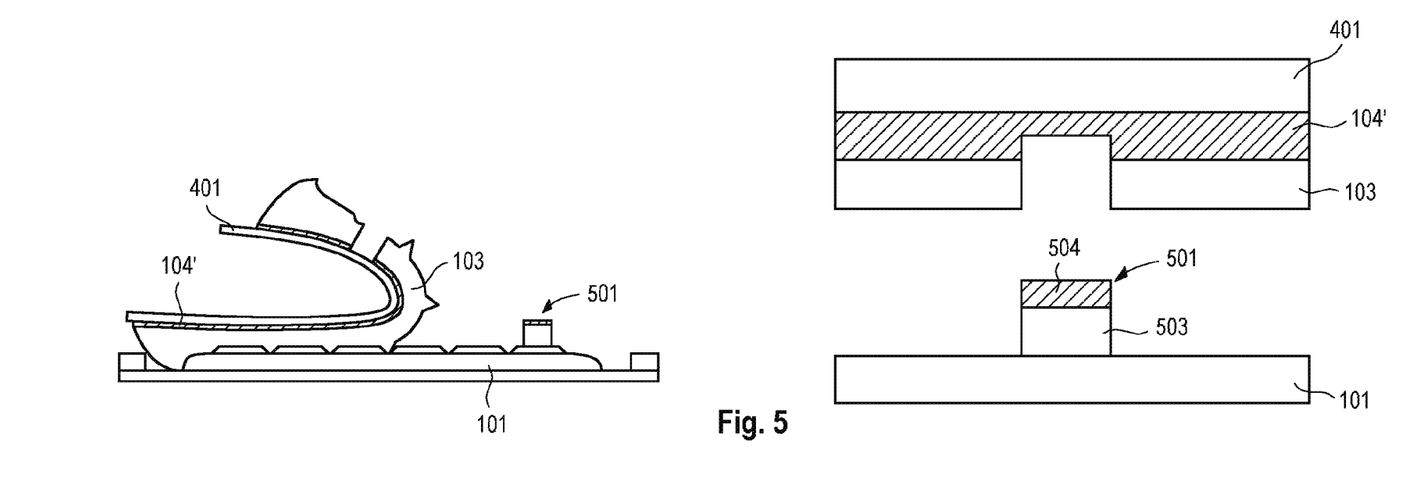
FIG. 5 is an exemplary sectional view of the wafer and the peeling tape after an incomplete peeling process and an exemplary schematic representation of the respective layer composition.

Relating to FIG. 5 the peeling tape 401 is then peeled to remove the adhesive film 103 and, if present, the decomposed release layer 104' from the wafer 101. During the peeling process it might be the case that the peeling tape 401 does not completely remove the adhesive film 103 (and, e.g., the decomposed release layer 104') from the wafer 101. In this circumstance, one or more adhesive residues 501 may remain on the wafer 101. The adhesive residue 501 may include adhesive material 503 from the adhesive film 103 and, e.g., release layer material 504 from the decomposed (or not sufficiently decomposed) release layer 104'.

During subsequent wafer processing or wafer handling such adhesive residues 501 may cause problems. Further, wafers 101 with adhesive residues 501 must not be delivered to customers. Hence, there is a demand to perform an examination to detect whether or not such adhesive residues 501 are remaining on the wafer 101.

Figure 6:
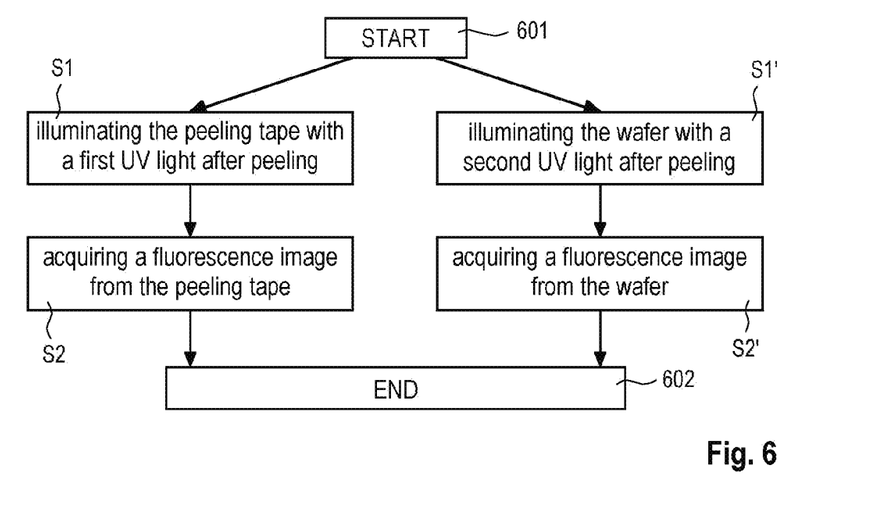
FIG. 6 is a flowchart illustrating an example of a process of detecting adhesive residue on a wafer after peeling an adhesive film from the wafer by using a peeling tape.

FIG. 6 illustrates an example of a process of detecting adhesive residues 501 on a wafer 101 after peeling an adhesive film 103 from the wafer 101 by using a peeling tape 401.

The process may start at 601. According to a first aspect of the disclosure, at S1 the peeling tape 401 is illuminated with first UV light after peeling.

At S2 a fluorescence image from the peeling tape 401 is acquired.

According to a second aspect of the disclosure, at S1' the wafer 101 is illuminated with second UV light after peeling.

At S2' a fluorescence image from the wafer 101 is acquired. The process may terminate at 602.

While S1, S2 of the first aspect relate to an indirect verification of adhesive residue 501 on the wafer 101 via examination of the peeling tape 401, S1', S2' of the second aspect relate to direct wafer inspection. S1, S2 of the first aspect and S1', S2' of the second aspect may be combined, if desired. S2 (image acquisition) is performed during S1 (illumination), and S2' (image acquisition) is performed during S1'(illumination).

According to an aspect of the disclosure, the first UV light may be directed towards a first side of the peeling tape 401, wherein the first side of the peeling tape 401 faces the wafer 101 during peeling. That way a frontlight fluorescence image from the peeling tape 401 is acquired. A frontlight fluorescence image allows for high detectability of adhesive residue 501 on the wafer 401.

Figure 7:
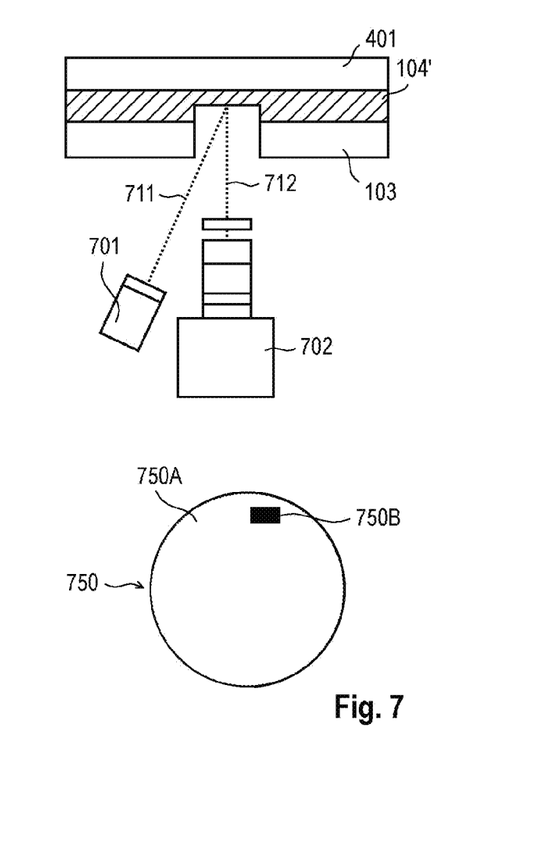
FIG. 7 is an exemplary schematic representation of illuminating a first side of the peeling tape with first UV light after peeling and acquiring a fluorescence image from the peeling tape.

FIG. 7 illustrates UV fluorescence imaging of the peeling tape 401 after it has been peeled from the wafer 101. A first UV light source 701 is configured to illuminate the peeling tape 401 with first UV light 711. A first camera 702 is configured to receive first fluorescence light 712 from the peeling tape 401 and to acquire a fluorescence image 750 from the peeling tape 401.

The first UV light source 701 is arranged to direct the first UV light 711 towards to a first side of the peeling tape 401 which faced the wafer 101 during peeling. That way, the fluorescence image 750 is taken from the peeled adhesive film 103. This is in order to detect adhesive residues 501 on the wafer 101 indirectly.

Upon UV light excitation, the adhesive film 103 emits blue/green fluorescence light which is detected by the first camera 702. Therefore, the fluorescence image 750 of the intact adhesive film 103 is bright (see the region 750A of the fluorescence image 750). The fluorescence light emission from the peeling tape 401 and/or the decomposed release layer 104' is much weaker than the fluorescence light emission from the adhesive material of the adhesive film 103. Therefore, on the contrary, regions on the adhesive film 103 where adhesive material 503 is missing appear dark in the fluorescence image 750 (see the region 750B of the fluorescence image 750). Further, the fluorescence light emission from the peeling tape 401 is in a spectral range of shorter wavelength than the spectral range of the fluorescence light emission from the adhesive material of the adhesive film 103. This allows to adjust a lower transmission band wavelength of a bandpass filter to better suppress the fluorescence light from the peeling tape 401 received by the first camera 702. Further, an upper transmission band wavelength of the bandpass filter could, e.g., be adjusted to suppress as much as possible stray light.

It is to be noted that deviations in the thickness of the decomposed release layer 104' do not have negative influence on the sensitivity or reliability of the adhesive residue detection in FIG. 7. The first camera 702 and the first UV light source 701 face the first side of the peeling tape 401, i.e. are arranged to generate a frontlight fluorescence image 750 from the peeling tape 401. Therefore, no transmission light (i.e. backlight) through the peeling tape 401 and/or through the decomposed release layer 104' needs to be used for imaging.

A completeness check for the adhesive film 103 may be performed on the basis of the fluorescence image 750. The check may be based on the fact that a complete adhesive film 103 fills a circular shape that has a defined diameter. For a wafer 101 without adhesive residue 501 no parts should be missing inside that circular region. Hence, adhesive residue 501 at the wafer edge can be detected indirectly with UV fluorescence imaging, as illustrated in FIG. 7, based on a completeness check.

According to an aspect of the disclosure, a second side of the peeling tape 401 opposite the first side may be illuminated with first visible or IR (infrared) backlight after peeling, and a backlight image from the peeling tape 401 is acquired. The backlight image may be used for detecting imprints of particles visible in the backlight image and possibly not or to a lesser extent visible in the fluorescence image 750 from the peeling tape 401.

Figure 8:
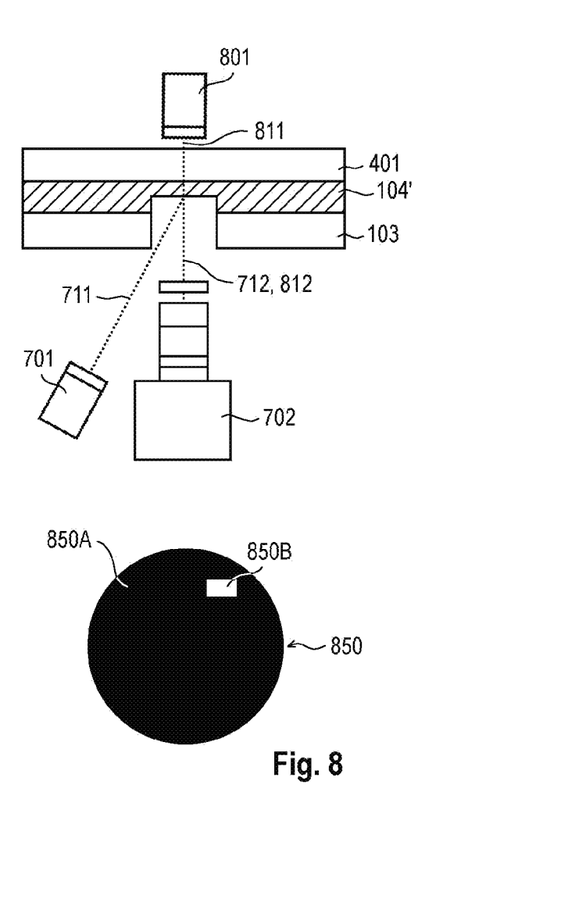
FIG. 8 is an exemplary schematic representation of illuminating a second side of the peeling tape opposite the first side with first visible or IR (infrared) backlight after peeling and acquiring a backlight image from the peeling tape.

FIG. 8 illustrates acquiring in addition to the fluorescence image 750 a backlight image 850 from the peeling tape 401. To that end, a first visible or IR light source 801 is arranged to illuminate a second side of the peeling tape 401 opposite the first side with first visible or IR light 811 after peeling.

The backlight image 850 from the peeling tape 401 is based on first transmission visible or IR light 812 as received by the first camera 702 (or a separate camera for backlight imaging).

The backlight image 850 may be acquired by a separate camera (not shown) or by the same first camera 702 used to acquire the fluorescence image 750 of the peeling tape 401. If the same first camera 702 is used, first UV light and first visible or IR backlight multiplexing may be applied. In this case, the first camera 702 may, e.g., have only one wavelength channel and the correlation to the different lights (UV light/visible or IR backlight) is made in the time domain. Additionally or alternatively, the first camera 702 may have at least one wavelength channel for fluorescence light from the adhesive layer and at least one wavelength channel for visible or IR backlight. In this case, the correlation to the different lights (UV light/visible or IR backlight) is made in the wavelength domain and the light sources (first UV light source 701 and first visible or IR light source 801) could be operated simultaneously. By way of example, the first camera 702 may have a blue/green channel for the first fluorescence light 712 and may have a red/IR channel for the first transmission visible or IR light 812. Using the same first camera 702 for obtaining the fluorescence image 750 and the backlight image 850 from the peeling tape 401 may reduce the costs for the detection equipment.

Regions on the peeling tape 401 where the adhesive film 103 and, e.g., the decomposed release layer 104' or a part thereof are missing appear bright in the backlight image 850, see the region 850B in the backlight image 850. On the contrary, regions on the peeling tape 401 where no adhesive material is missing and the decomposed release layer 104' is complete appear dark in the backlight image 850, see the region 850A in the backlight image 850.

However, the light transmittance of the first transmission visible or IR light 812 towards the first camera 702 (or a separate camera) may depend mainly on the thickness and/or light transmittance of the decomposed release layer 104' and less on the presence of the adhesive film 103 itself. It was found that most of the contrast is not caused by the adhesive film 103 itself but mainly comes from the decomposed release layer 104'. Because of this a bright region in a backlight image 850 of an adhesive film may not be a reliable indicator whether it is just the decomposed release layer 104' or the decomposed release layer 104' and the adhesive film 103 that is missing in that region.

Hence, the backlight imaging method of FIG. 8 may rely on that the thickness of the decomposed release layer 104' exceeds a certain minimum thickness (e.g. sufficiently shields the backlight). If this is not fulfilled (e.g. because of missing parts of the decomposed release layer 104' remaining on the carrier 102), this could lead to false alarms in the adhesive residue 501 detection if such detection would only rely on the backlight image 850.

In other words, the part of the decomposed release layer 104' that is located at regions of the peeling tape 401 where the adhesive film 103 is missing should fall below a certain thickness to allow a sufficient transmission of first visible or IR light 811 from the first visible or IR light source 801. Otherwise, the adhesive residue 501 may not be detected by the backlight imaging method illustrated in FIG. 8.

Further, during the peeling of the adhesive film 103 it can happen that the decomposed release layer 104' (e.g. decomposed LTHC layer) locally separates from the adhesive film 103. In that case part of the adhesive film 103 stays on the wafer 101 as an adhesive residue 501. Because of the separation of decomposed release layer 104' and the adhesive film 103 the decomposed release layer 104' may cover all over a region that has the shape of a wafer on the peeling tape 401.

This is no problem for the inspection method based on fluorescence imaging of the adhesive film 103 on the peeling tape 401: The region of the peeling tape 401 where nothing is attached appears dark in the fluorescence image 750. The decomposed release layer 104' does not fluoresce. Therefore, also the region of the peeling tape 401 where only the decomposed release layer 104' is attached appears dark in the fluorescence image 750. Only the region where the adhesive film 103 is attached to the peeling tape 401 appears bright in the fluorescence image 750. Hence the fluorescence imaging method results in a good image contrast that allows detecting an incomplete adhesive film 103 and is least influenced by variations (e.g. in thickness, degree of decomposition, etc.) in the decomposed release layer 104'. On the other hand, in the inspection method relying on backlight imaging of the adhesive film 103, as most of the image contrast between the adhesive film 103 and background is not caused by the adhesive film 103 itself but mainly comes from the decomposed release layer 104', the decomposed release layer 104' has a negative impact on (indirect) adhesive residue detection on a wafer.

For these and other reasons the visible or IR backlight imaging method is not equivalent with the UV frontlight fluorescence imaging method of FIG. 7. However, as shown in FIG. 8, the backlight imaging technique may be combined with the UV frontlight fluorescence imaging method of FIG. 7. This combination may improve the detectability of small adhesive residues 501 on the wafer edge. It may also allow the indirect detection of particles that might be on the peeling chuck. This detection is based on imprints of such particles visible in the backlight image.

Figure 9:
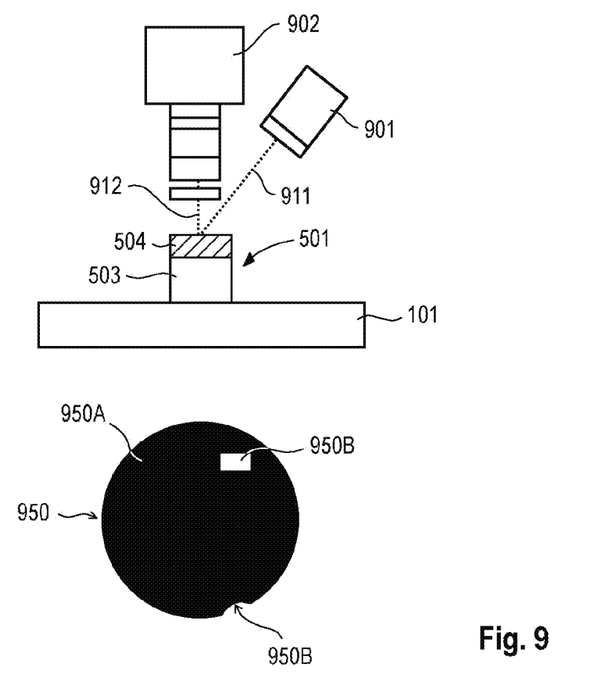
FIG. 9 is an exemplary schematic representation of illuminating the wafer with second UV light after peeling and acquiring a fluorescence image from the wafer.

Referring to FIG. 9, a second UV light source 901 may be configured to illuminate the wafer 101 with second UV light 911 after peeling. Further, a second camera 902 may be configured to acquire a fluorescence image 950 from the wafer 101.

In the fluorescence image 950 regions on the wafer 101 where no adhesive residue 501 is present appear dark, since no second fluorescence light 912 is emitted from the wafer 101. On the other hand, an adhesive residue 501 on the wafer 101 shows up as a bright region 950B in the fluorescence image 950.

The method and arrangement shown in FIG. 9 may in particular be applicable for wafer technologies that show no fluorescence effects. On the other hand, for wafer technologies which show fluorescence effects there may be a distinction between the fluorescence effects caused by the wafer technology and the fluorescence effects caused by the adhesive residue 501 to be detected. The method may therefore include a process of determining whether a fluorescence effect is caused by the wafer technology or by adhesive residue 501.

Further, the (direct) adhesive residue detection as shown in FIG. 9 may be affected by characteristics of the decomposed release layer material 504 on the adhesive residue 501. The decomposed release layer material 504 faces towards the second UV light source 901 and towards the second camera 902 and may therefore partially shield the incoming second UV light 911 and partly block the emitted second fluorescence light 912. Therefore, other than in the indirect UV fluorescence imaging approach of FIG. 7, the performance of the direct UV fluorescence imaging method of FIG. 9 may depend to some extent on characteristics (e.g. material, thickness, etc.) of the decomposed release layer material 504.

The method and arrangement shown in FIG. 9 may have a high detectability for even small adhesive residue 501 on the wafer 101 and, in particular, also on the edge of the wafer 101.

It is to be noted that the methods and arrangements of FIGS. 7 and 9 may be combined. Further, the visible or IR backlight imaging technique shown in FIG. 8 may be combined with one or both of the UV fluorescence imaging methods of FIGS. 7 and 9.

Figure 10A:
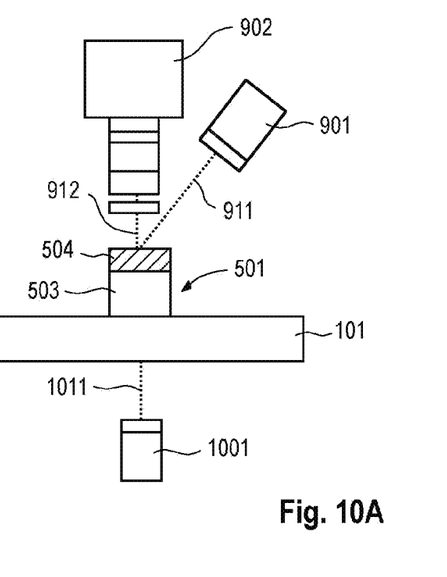
FIG. 10A is the exemplary schematic representation of FIG. 9 and additionally illustrates illuminating the wafer with visible or IR backlight and acquiring a backlight image from the wafer.

Referring to FIG. 10A, a second visible or IR light source 1001 may be arranged to illuminate the wafer 101 with visible or IR backlight 1011 and a backlight image from the wafer 101 may be acquired. A backlight image from the wafer 101 may, e.g., be acquired by the second camera 902 or by a separate camera. The backlight image can be used to detect broken wafers, cracks or edge defects on the wafer 101.

Figure 10B:
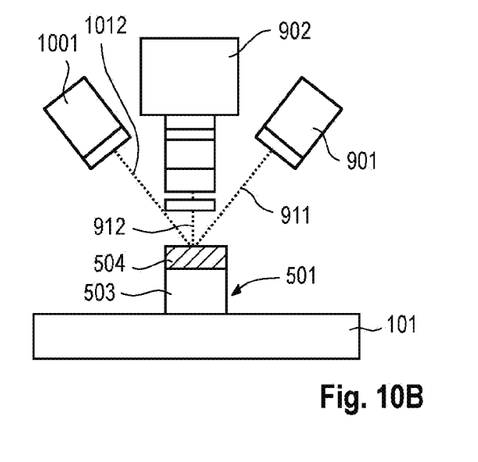
FIG. 10B is the exemplary schematic representation of FIG. 9 and additionally illustrates illuminating the wafer with visible or IR frontlight and acquiring a frontlight image from the wafer.

Referring to FIG. 10B, the second visible or IR light source 1001 may be arranged to illuminate the wafer 101 with visible or IR frontlight 1012. A frontlight image from the wafer 101 may be acquired either by the second camera 902 or by another separate camera. The frontlight image from the wafer 101 can be used to detect defects on the wafer 101.

In general, if the same second camera 902 is used for acquiring the UV fluorescence image and the backlight image (FIG. 10A) or frontlight image (FIG. 10B), second UV light and second visible or IR backlight multiplexing may be applied. In this case, the second camera 902 may, e.g., have only one wavelength channel and the correlation to the different lights (UV light/visible or IR backlight) is made in the time domain. Additionally or alternatively, the second camera 902 may have at least one wavelength channel for fluorescence light and at least one wavelength channel for visible or IR backlight. In this case, the correlation to the different lights (UV light/visible or IR backlight) is made in the wavelength domain and the light sources (second UV light source 901 and second visible or IR light source 1001) could be operated simultaneously (i.e. without multiplexing). By way of example, the second camera 902 may have a blue/green channel for the second fluorescence light 912 and may have a red/IR channel for the visible or IR backlight 1011 or the visible or IR frontlight 1012. Using the same second camera 902 for obtaining the fluorescence image 950 and the backlight or frontlight images from the wafer 101 (or from the peeling chuck 1110 as will be detailed further below) may reduce the costs for the detection equipment.

Figure 11:
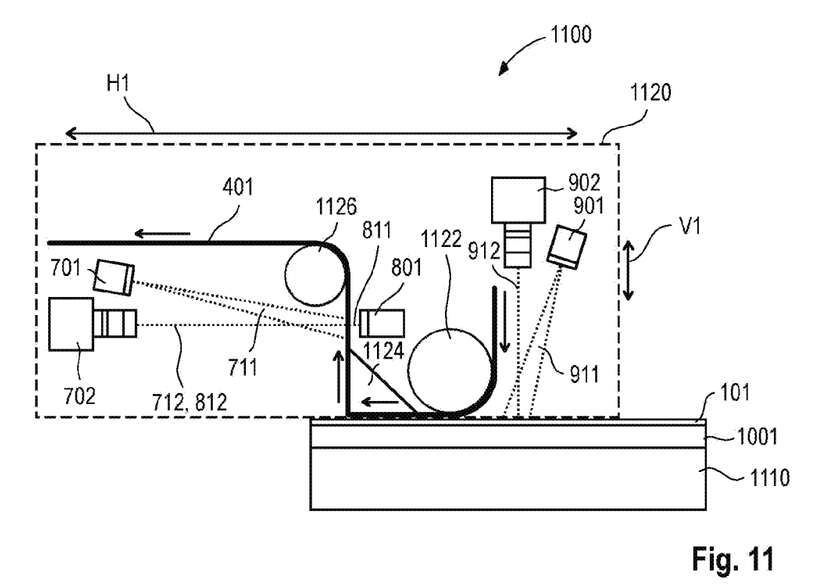
FIG. 11 is a side view of an exemplary detection arrangement for adhesive residue detection accommodated in a movable peeling unit.

FIG. 11 illustrates a side view of an exemplary detection arrangement 1100 for adhesive residue detection. The detection arrangement 1100 may, e.g., include the first UV light source 701 and the first camera 702 as shown in FIG. 7. The detection arrangement 1100 may, e.g., include the first visible or IR light source 801. Further, the detection arrangement 1100 may alternatively or additionally include the second UV light source 901 and/or the second camera 902 as illustrated in FIG. 9.

The wafer 101 may be placed on a peeling chuck 1110. The second visible or IR light source 1001 may, e.g., be integrated as a backlight source in the peeling chuck 1110.

The detection arrangement 1100 may include a peeling unit 1120. The peeling unit 1120 may be moveable in a horizontal direction indicated by arrow H1 relative to the peeling chuck 1110 and the wafer 101 placed on the peeling chuck 1110. Further, the peeling unit 1120 may, e.g., be movable relative to the peeling chuck 1110 in a vertical direction indicated by arrow V1.

The peeling unit 1120 may include a peeling roller 1122 and a peeling bar 1124. Further, the peeling unit 1120 may include an idler roller 1126.

All parts contained in the peeling unit 1120 may be moveable in the direction of arrow H1 and/or in the direction of arrow V1 together with peeling unit 1120. As shown in FIG. 11, the peeling tape 401 that is first rolled on the wafer 101 by peeling roller 1122 and then peeled from the wafer 101 by peeling bar 1124 may be inspected (e.g. scanned) with the first camera 702. The adhesive side of the peeling tape 401 is directed towards the first camera 702, see also FIG. 7. Hence, the adhesive film 103 that was mounted on the wafer 101 is directed towards the first camera 702. From the camera point of view, the decomposed release layer 104' is located behind the adhesive film 103.

The peeling tape 401 is illuminated with the first UV light 711 in the frontlight mode (meaning that the first UV light source 701 and the first camera 702 are disposed at the same side of the peeling tape 401). By way of example, the first UV light 711 may have a peak wavelength in the near UV-A range, e.g. at about 375 nm. The excitation of the adhesive film 103 with UV light causes fluorescence in the visible (e.g. blue/green) range of the light. A high-pass filter with a cut-on wavelength of, e.g., about 415 nm may be used in front of the first camera 702 in order to block the UV light that is used for excitation.

Further, as also illustrated in FIG. 8, the peeling tape 401 may be illuminated with first visible or IR light 811 from the first visible or IR light source 801. The first visible or IR light source 801 may, e.g., contain white LEDs.

The distance between the peeling tape 401 and the arrangement comprising the first camera 702, the first UV light source 701 and the (optional) first visible or IR light source 801 may be kept constant. In other words, these parts, and, e.g., all other parts illustrated to be included in the peeling unit 1120 may be moved in horizontal and vertical directions together with the peeling unit 1120.

The fluorescence image 750 from the peeling tape 401 and the backlight image 850 from the peeling tape 401 may be acquired with the same first camera 702. Further, the fluorescence image 750 from the peeling tape 401 and the backlight image 850 from the peeling tape 401 may be acquired during a single scan. In this case, if the same first camera 702 is used to acquire both images 750 and 850, first UV light 711 and first visible or IR light 811 multiplexing may be used. That is, the first UV light source 701 and the first visible or IR light source 801 may be alternately switched and corresponding image lines of the fluorescence image 750 and the backlight image 850 may be acquired in alternation by the first camera 702. As mentioned above, multichannel imaging may alternatively or additionally be applied.

The motion of the peeling tape 401 and the acquisition of image information by the first camera 702 may be synchronized. By way of example, the first camera 702 may be a line scan camera and the motion of the peeling tape 401 may be synchronized with an encoder signal. The pulse frequency of this encoder signal may be proportional to the rate of feed of the peeling tape 401.

During peeling the peeling unit 1120 moves from the left side of the peeling chuck 1110 to the right side thereof. Thereby an image of the wafer 101 with the adhesive film 103 still on the wafer 101 can be acquired with the second camera 902.

Figure 12:
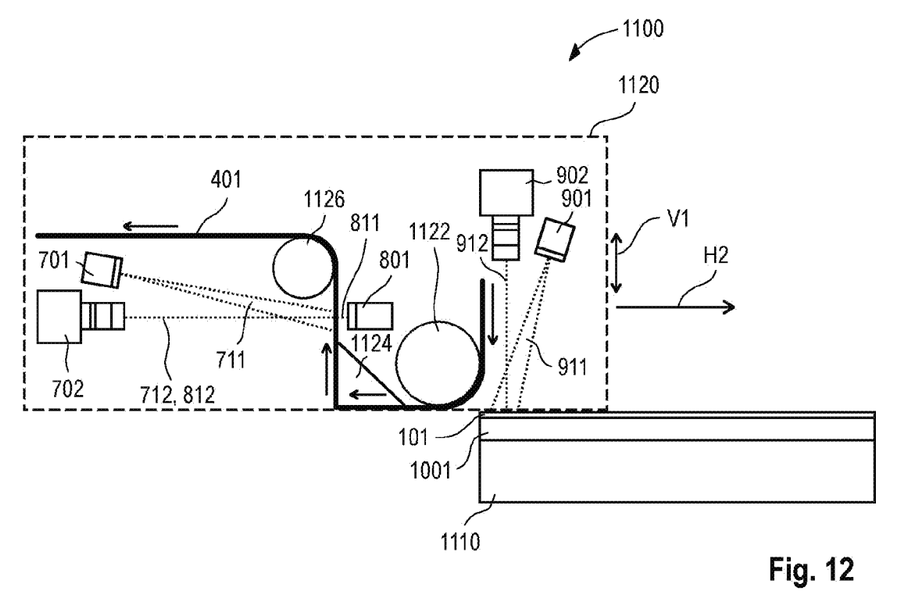
FIG. 12 is a side view of the detection arrangement of FIG. 11 before peeling.

FIG. 12 illustrates the position of the peeling unit 1120 before peeling (e.g., even before application of the peeling tape 401) and, e.g., shortly after the image acquisition from the second camera 902 started. The wafer 101 may be illuminated with the second UV light source 901 in frontlight mode. Hence, the adhesive film 103 on the wafer 101 will fluoresce, assuming that it is not covered with too much decomposed release layer 104'.

Arrow H2 indicates the direction of horizontal motion of the peeling unit 1120 relative to the peeling chuck 1110 during peeling.

Figure 13:
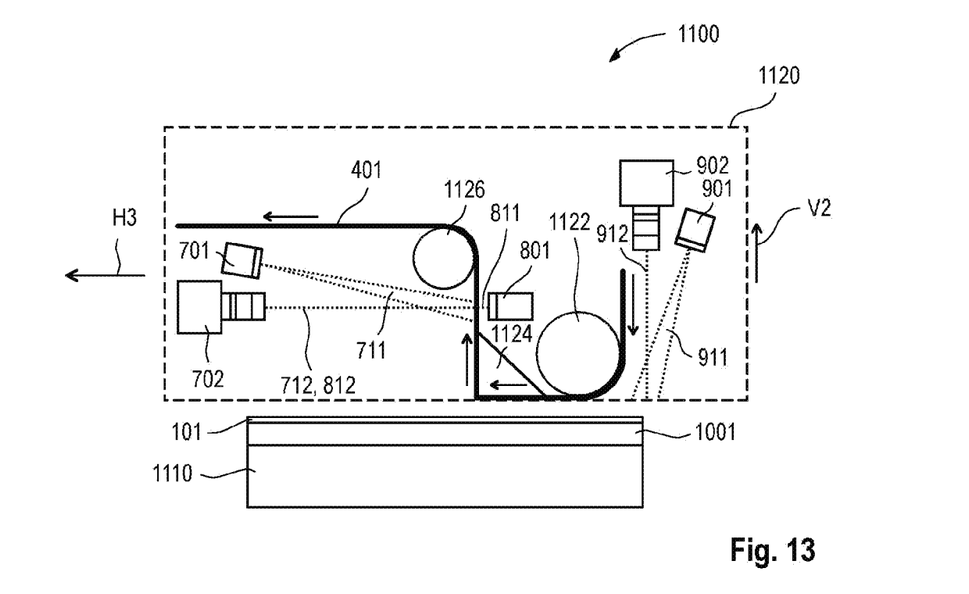
FIG. 13 is a side view of the detection arrangement of FIGS. 11 and 12 after peeling.

After the peeling process has ended the peeling unit 1120 may first move up in the vertical direction in accordance with arrow V2 of FIG. 13 and then moves backwards across the wafer 101 in the direction indicated by arrow H3. During the backward motion of the peeling unit 1120 another image of the wafer 101 can be acquired with the second camera 902. In this respect reference is made to FIG. 9 illustrating direct wafer inspection by using the second UV light source 901 and the second camera 902. Hence, adhesive residue 501 on the wafer 101 will fluoresce assuming that the adhesive residue 501 is not covered with too much decomposed release layer material 504.

Further, also referring to FIG. 10A, backlight images of the wafer 101 can be acquired in addition to the fluorescence images of the wafer 101. These backlight images may be also acquired with the second camera 902. In order to acquire the fluorescence and backlight images simultaneously, second UV light 911 and second visible or IR backlight 1011 multiplexing may be used, i.e. the second UV light 911 and hence the second fluorescence light 912 and the visible or IR backlight 1011 of the peeling chuck 1110 may be alternately switched and corresponding image lines of the fluorescence image of the wafer 101 and the backlight image of the wafer 101 may be acquired in alternation. Further, multichannel imaging may alternatively or additionally be applied.

The working distance of the second camera 902 from the wafer 101 between forward and backward motion of the peeling unit 1120 may be different, because the peeling unit 1120 may be lifted (see arrow V2) before it moves backward. In order to obtain a sharp image for both working distances, an automatic focus can be implemented (e.g. a focusing mechanism or a focus tunable lens may be implemented). Alternatively, the second camera 902 may be mounted to be displaceable in vertical direction to keep its working distance constant. By way of example, the second camera 902 may be mounted on top of a motorized linear Z-axis actuator (not shown) which may be mounted to the peeling unit 1120.

It is to be noted that the detection arrangement 1100 for adhesive residue detection may be part of an inline demounter. An inline demounter may provide for demounting the wafer 101 from the carrier 102 (see, e.g., FIGS. 2, 3) and for peeling the adhesive film 103 from the wafer 101 (see, e.g., FIGS. 4, 5).

All methods and detection arrangements disclosed herein for direct wafer inspection may alternatively or additionally be used for inspection of the peeling chuck 1110 (when no wafer 101 is placed thereon).

According to an aspect of the disclosure, the peeling chuck 1110 may be illuminated with second UV light 911 and a fluorescence image from the peeling chuck 1110 may be acquired (e.g. by using the second camera 902). Reference is made to FIG. 9 and the corresponding disclosure which is also applicable for inspection of the peeling chuck 1110 (i.e. when no wafer 101 is placed on the peeling chuck 1110 so that the peeling chuck 1110 is exposed to the second UV light 911). This fluorescence image from the peeling chuck 1110 can be used to detect adhesive residues and fluorescent particles on the peeling chuck 1110. Such particles could cause mechanical defects on the wafer 101.

According to an aspect of the disclosure, the peeling chuck 1110 may be illuminated with a frontlight in the visible or IR range and a frontlight image from the peeling chuck 1110 may be acquired (e.g. by using the second camera 902). Reference is made to FIG. 10B and the corresponding disclosure which is applicable with the wafer 101 replaced by the peeling chuck 1110 (i.e. when no wafer 101 is placed on the peeling chuck 1110 so that the peeling chuck 1110 is exposed to the visible or IR frontlight 1012). This frontlight image from the peeling chuck 1110 can be used to detect particles on the peeling chuck 1110. Such particles could cause mechanical defects on the wafer 101.

According to an aspect of the disclosure, assuming that the peeling chuck 1110 is transparent or semi-transparent, the peeling chuck 1110 may be illuminated with a backlight in the visible or IR range and a backlight image from the upper surface of the peeling chuck 1110 may be acquired (e.g. by using the second camera 902). Reference is made to FIG. 10A and the corresponding disclosure which is applicable with the wafer 101 replaced by the peeling chuck 1110 (i.e. when no wafer 101 is placed on the upper surface of the peeling chuck 1110 so that the upper surface of the peeling chuck 1110 is exposed to the camera acquiring the backlight image (e.g. the second camera 902)). As described above, the second visible or IR light source 1001 may be installed in the peeling chuck 1110. The backlight image from the surface of the peeling chuck 1110 can be used to detect particles on the peeling chuck 1110. Such particles could cause mechanical defects on the wafer 101.

Exemplary detection arrangements and methods to acquire such images (e.g. fluorescence image, frontlight image, backlight image) have been described with reference to FIGS. 11 to 13 in conjunction with (direct) wafer inspection. In view of the inspection of the peeling chuck 1110 reference is made to this disclosure to avoid reiteration.

Each of the images mentioned above (i.e. the images from the adhesive film 103, the images from the wafer 101 and, e.g., images from the peeling chuck 1110) can be generated in such a way that these images can be mapped to a common coordinate system, e.g. a wafer or a peeling chuck coordinate system. The mapping can be done based on a calibration routine that has been performed for the cameras. The representation in a common coordinate system makes it easier to work with these images. These images can also be organized in an image stack. Image analysis algorithms and classification algorithms may be applied to these images or the image stack in order to detect certain defects and process deviations from pre-processes or within the demounting process.

Each of the images mentioned above (i.e. the images from the adhesive film 103, the images from the wafer 101 and, e.g., images from the peeling chuck 1110) can be analyzed visually and/or by using computer based or computer assisted image analyzing methods and tools, e.g. computer programs. Image analyzing methods may, e.g., comprise image segmentation and/or identification of image objects and/or classification of identified image objects. Image segmentation may comprise thresholding, i.e. generating a black and white image (or a grey scale value image) based on comparing the values of image voxels (e.g. brightness values) with a threshold (e.g. brightness threshold) or with multiple thresholds (e.g. multiple brightness thresholds). The segmented image may be analyzed for object identification (e.g. identifying a list of objects from the segmented image). Object classification may be based on object identification. Object classification may, e.g., include determining whether an identified object is an adhesive residue, a scratch, a particle, etc.

Further, image analysis methods may comprise generating image information based on image comparison. E.g. two or more images or segmented images or identified corresponding objects from two or more images or classified corresponding objects from two or more images may be compared. For example, comparison may include subtraction of brightness values of corresponding image voxels or subtraction of corresponding grey scale values of segmented images. Further, comparison may be based on all kinds of different images (fluorescence image, backlight image, frontlight image) from one or more of all kinds of different imaged parts (peeling tape 401, wafer 101, peeling chuck 1110), and the disclosure is intended to include all of these combinations.

Figure 14:
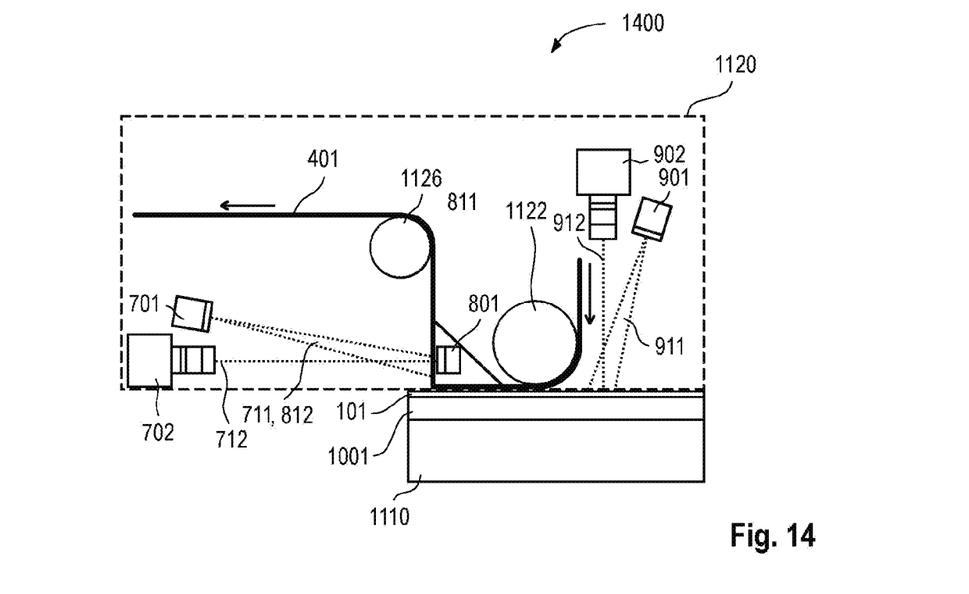
FIG. 14 is a side view of another exemplary detection arrangement for adhesive residue detection accommodated in a movable peeling unit.

Referring to FIG. 14, an exemplary detection arrangement 1400 for adhesive residue detection may be identical to the detection arrangement 1100 for adhesive residue detection except that the position of the first UV light source 701 and/or the position of the first camera 702 and/or the position of the first visible or IR light source 801 may be changed to allow "early inspection" of the peeling tape 401 after the peeling process. More specifically, the peeling tape 401 may be inspected at a position where it is still on the peeling bar 1124.

To that end, the first visible or IR light source 801 may be integrated in the peeling bar 1124. Further, the first UV light source 701 may be positioned at a vertical level overlapping with the vertical extension of the peeling bar 1124. That way, the distance between the peeling bar 1124 and the idler roller 1126 may be reduced and the vertical dimension of the peeling unit 1120 may decrease. As to other features of the detection arrangement 1400 for adhesive residue detection, reference is made to the corresponding disclosure of the detection arrangement 1100 for adhesive residue detection and reiteration thereof is avoided for the sake of brevity.

Figure 15:
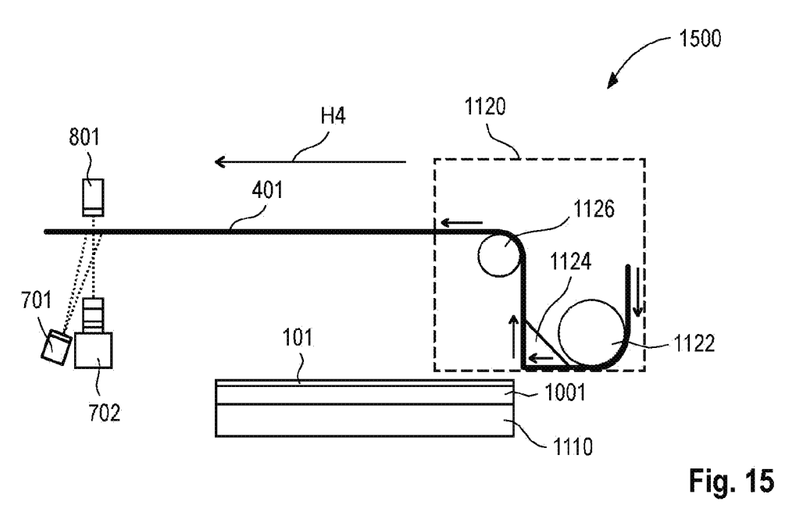
FIG. 15 is a side view of an exemplary detection arrangement for adhesive residue detection accommodated outside a movable peeling unit.

A detection arrangement 1500 for adhesive residue detection illustrated in FIG. 15 distinguishes from the detection arrangements 1100, 1400 for adhesive residue detection by the position of the first UV light source 701 and/or the position of the first camera 702 and/or the position of the first visible or IR light source 801. Here, these parts are arranged in a fixed position relative to the peeling chuck 1110. Further, these parts may be arranged external to the movable peeling unit 1120. The first UV light source 701, the first camera 702 and the first visible or IR light source 801 do not move together with the peeling unit 1120. Other features of the detection arrangement 1500 for adhesive residue detection may be identical to the corresponding features of the detection arrangements 1100, 1400 for adhesive residue detection, and reference is made to the above disclosure to avoid reiteration.

The detection arrangement 1500 for adhesive residue detection may facilitate retrofitting of an existing demounter with an inline inspection system. In particular, if there is not enough space available in the peeling unit 1120 to implement the first UV light source 701, the first camera 702 and the first visible or IR light source 801 in the peeling unit 1120, the external disposal of these components may be advantageous.

The detection arrangement 1500 for adhesive residue detection is different from the detection arrangements 1100, 1400 for adhesive residue detection in that during the peeling process the peeling tape 401 is only moving relative to the peeling roller 1126, the peeling bar 1124 and the idler roller 1122. Since the first camera 702 (and, e.g., the first UV light source 701 and the first visible or IR light source 801) are installed in a fixed position to the peeling chuck 1110, the peeling tape 401 does not move relative to the first camera 702.

Hence, imaging of the peeling tape 401 with the first camera 702 is not performed during the peeling process. Rather, the fluorescence image and/or the backlight image from the peeling tape 401 is acquired by the first camera 702 while the peeling unit 1120 is moving backwards as illustrated by arrow H4. This backward motion of the peeling unit 1120 is performed in an elevated vertical position relative to the position of the peeling unit 1120 during the peeling process.

Figure 16:
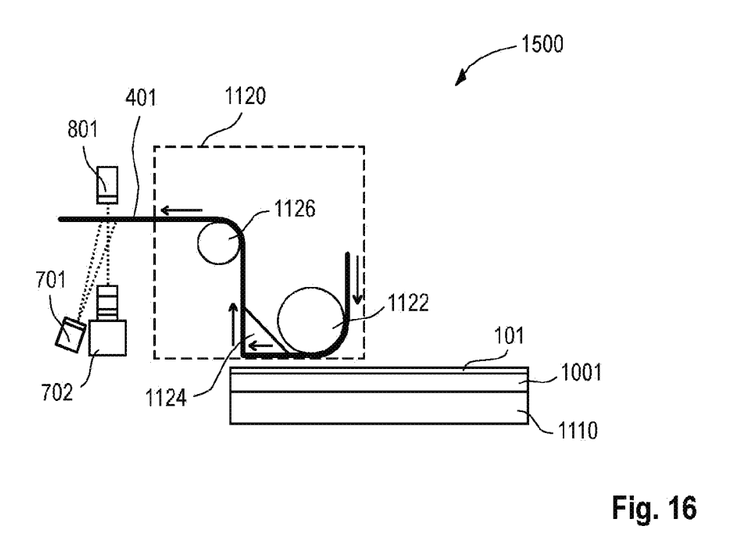
FIG. 16 is a side view of the detection arrangement of FIG. 15 during the image acquisition from the first camera.

FIG. 16 illustrates the position of the peeling unit 1120 after the fluorescence image acquisition by the first camera 702 is finished. The first camera 702 may be positioned so as to guarantee that the adhesive film 103 of the previously peeled wafer 101 is completely within the image region of the first camera 702.

The acquisition of fluorescence image lines for the first camera 702 and the horizontal motion of the peeling unit 1120 may be synchronized with an encoder signal. The pulse frequency of this encoder may be proportional to the horizontal speed of the peeling unit 1120. In the detection arrangement 1500 for adhesive residue detection and also in the other detection arrangements 1100, 1400 disclosed herein, a section of the peeling tape 401 may be marked with a label or marking indicative of the particular wafer 101 which was peeled with the corresponding section of the peeling tape 401. That is, the label or marking may contain information about the particular wafer 101 that was peeled with the corresponding section of the peeling tape 401. The label or marking can be read in the image(s) of the peeling tape 401 acquired by the first camera 702. This may facilitate to avoid mix-ups between the image(s) of the peeling tape 401 and the corresponding wafer 101. It may be particularly useful in case of long distances between the peeling unit 1120 and the first camera 702.

As in all embodiments described herein, also in the detection arrangement 1500 for adhesive residue detection a second camera 902 (not shown in FIGS. 15, 16) combined with, e.g., a frontlight or backlight in the visible or near IR range (e.g. the second visible or IR light source 1001) may be provided. This allows the acquisition of images of the wafer 101 before and after peeling. Further, additionally or alternatively in this and/or other embodiments described herein, a second UV light source 901 may be provided to allow acquisition of fluorescence images of the wafer 101 before and/or after peeling.

As already mentioned above, the second camera 902 may also be configured to image the peeling chuck 1110 when there is no wafer 101 on the peeling chuck 1110. This can be combined with second UV light 911 (e.g. in another wavelength range of the spectrum of the UV light than used for imaging the wafer 101) or with the backlight illumination 1001 of the peeling chuck 1110.

In all embodiments, the first camera 702 and/or the second camera 902 may be a line scan camera, an area scan camera or a contact image sensor (CIS) with integrated illumination. If a CIS is used, frontlight illumination sources (e.g. first UV light source 701, second UV light source 901, any visible or IR frontlight) may be integrated in the CIS.

Figure 17:
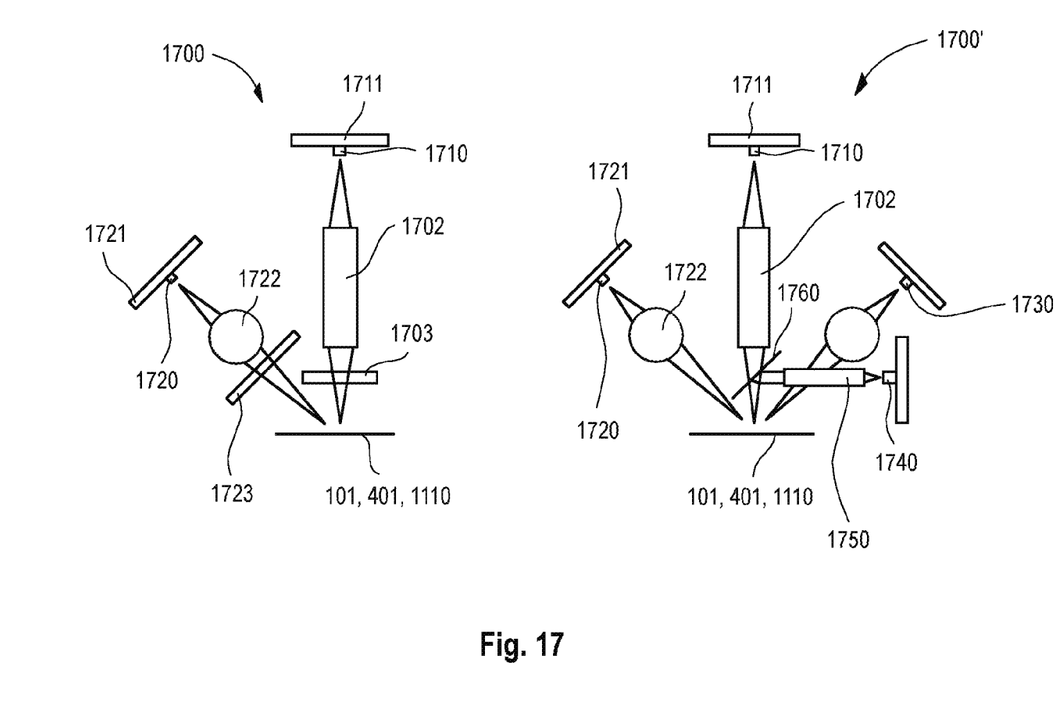
FIG. 17 is an exemplary schematic representation of two exemplary contact imaging sensors (CIS) which could be used for UV light illumination and acquiring a fluorescence image of a peeling tape or a wafer and/or a peeling chuck.

A fluorescence imaging setup for a CIS 1700 is shown on the left side of FIG. 17. The camera portion of the CIS 1700 may include a sensor 1710, a lens 1702 and (optionally) a UV blocking filter 1703. The light source portion of the CIS 1700 may include a UV LED 1720, a lens 1722 and (optionally) a visible or IR light blocking filter 1723. The sensor 1710 may be part of a sensor array mounted on a sensor board 1711, and the UV LED 1720 may be part of an array of UV LEDs mounted on a LED board 1721.

On the right side of FIG. 17 it is shown that multiple illuminations can be combined within a CIS 1700' in order to acquire images with different illumination modes. In the setup on the right side of FIG. 17 further LEDs 1730 and 1740 are implemented in the CIS 1700'. A UV LED can be used for the LED 1730 for the diffuse light or for the LED 1740 for the true coaxial light, which is coupled in by, e.g., a light guide or optical fiber 1750 and a beamsplitter 1760. A UV blocking filter (not shown) can be placed in front of the lens 1702. The CIS 1700' can also be combined with an external backlight line light (not shown). Therefore, all images described in the implementations above can also be acquired with a CIS (e.g. CIS 1700, 1700') instead of, e.g., a line scan camera or an area scan camera.

According to a further aspect, a wafer inspection system is disclosed. The wafer inspection system may be equipped with an inspection chuck (not shown) instead of or additionally to the peeling chuck 1110. By way of example, the inspection chuck may be included in (e.g. retrofit into) a demounter for demounting the wafer 101 from the carrier 102. The wafer inspection system may be an automated inline wafer inspection system.

The inspection chuck of the wafer inspection system may be designed in such a way that the wafer 101 can be flipped. The flipping of the wafer 101 allows inspecting both, the front side of the wafer 101 and the back side of the wafer 101. Second camera 902 and light illumination (e.g. the second UV light source 901 and/or the second visible or IR light source 1011) may be arranged at that inspection chuck in the same way as described in relation to the peeling chuck 1110. That is, the UV light and fluorescence image inspection of the wafer 101 on the inspection chuck can optionally be combined with visible or IR backlight 1011.

Alternatively to the possibility of flipping the wafer 101, the inspection chuck can be designed in such a way that the wafer 101 can be viewed with cameras from the wafer front side and from the wafer back side at the same time. In this case, second cameras 902 and light illumination (e.g. second UV light sources 901 and/or second visible or IR light sources 1011) may be arranged at both sides of the inspection chuck. In both cases (wafer flipping or simultaneous two side inspection), a method may comprise illuminating the wafer with UV light from both sides, and acquiring fluorescence images from both sides of the wafer.

It is to be noted that such (automated inline) wafer inspection system does not necessarily need to be combined with a peeling unit 1120 as described above. In other words, a demounter as described herein may be equipped with an (e.g. automated inline) peeling unit 1120 and/or an (e.g. automated inline) wafer inspection system, or one or two of these devices are arranged in the downstream direction of wafer handling behind the demounter. E.g., for an automated inline wafer inspection system the wafer 101 can be handled to the inspection chuck that is, e.g., retrofit into the demounter.

All above disclosure in relation to imaging a wafer placed on a peeling chuck 1110 is applicable to the wafer inspection system configured to inspect a wafer 101 placed on the inspection chuck. This also includes the disclosure relating to image analysis.

The following examples pertain to further aspects of the disclosure:

Example 1 is a method of detecting adhesive residue on a wafer after peeling an adhesive film from the wafer by using a peeling tape, the method comprising illuminating the peeling tape with first UV light after peeling, and acquiring a fluorescence image from the peeling tape; and/or illuminating the wafer with second UV light after peeling, and acquiring a fluorescence image from the wafer.

In Example 2, the subject matter of Example 1 can optionally include wherein the first UV light is directed towards a first side of the peeling tape, the first side of the peeling tape faced the wafer during peeling.

In Example 3, the subject matter of Example 2 can optionally include illuminating a second side of the peeling tape opposite the first side with first visible or IR backlight after peeling; and acquiring a backlight image from the peeling tape.

In Example 4, the subject matter of Example 3 can optionally include wherein the fluorescence image from the peeling tape and the backlight image from the peeling tape are acquired with a same first camera having separate channels for fluorescence light from first UV light and first visible or IR backlight and/or using first UV light and first visible or IR backlight multiplexing.

In Example 5, the subject matter of any one of Examples 1 to 4 can optionally include illuminating the wafer with a second visible or IR backlight after peeling; and acquiring a backlight image from the wafer.

In Example 6, the subject matter of Example 5 can optionally include wherein the fluorescence image from the wafer and the backlight image from the wafer are acquired with a same second camera having separate channels for fluorescence light from second UV light and second visible or IR backlight and/or using second UV light and second visible or IR backlight multiplexing.

In Example 7, the subject matter of any one of Examples 1 to 6 can optionally include illuminating the wafer with a frontlight in the visible or IR range before and/or after peeling; and acquiring a frontlight image from the wafer.

In Example 8, the subject matter of any one of Examples 1 to 7 can optionally include using the second UV light to illuminate a peeling chuck when no wafer is disposed thereon; and acquiring a fluorescence image from the peeling chuck.

In Example 9, the subject matter of any one of Examples 1 to 8 can optionally include marking a section of the peeling tape with a label indicative of the particular wafer which was peeled with the corresponding section of the peeling tape.

Example 10 is a detection arrangement for detecting adhesive residue on a wafer after peeling an adhesive film from the wafer by using a peeling tape, the detection arrangement comprising: a first UV light source configured to illuminate the peeling tape with first UV light after peeling, and a first camera configured to acquire a fluorescence image from the peeling tape; and/or a second UV light source configured to illuminate the wafer with second UV light after peeling, and a second camera configured to acquire a fluorescence image from the wafer.

In Example 11, the subject matter of Example 10 can optionally include wherein the first UV light source and the first camera are accommodated in a movable peeling unit configured to translate forward and backward across the wafer.

In Example 12, the subject matter of Example 10 or 11 can optionally include wherein the first UV light source is configured to illuminate the peeling tape at a position on a peeling bar arranged adjacent to the wafer.

In Example 13, the subject matter of any one of Examples 10 to 12 can optionally include wherein the first UV light source and the first camera are stationary relative to the peeling position of the wafer.

In Example 14, the subject matter of any one of Examples 10 to 13 can optionally include wherein the first camera and/or the second camera is a line scan camera or an area scan camera.

In Example 15, the subject matter of any one of Examples 10 to 13 can optionally include wherein the first UV light source and the first camera and/or the second UV light source and the second camera comprise an array of contact image sensors with integrated illumination.

Example 16 is a method of inspecting a peeling chuck, the method comprising illuminating the peeling chuck with second UV light, and acquiring a fluorescence image from the peeling chuck.

Example 17 is a method of inspecting a wafer, the method comprising illuminating the wafer with UV light from both sides, and acquiring fluorescence images from both sides of the wafer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of detecting adhesive residue the method comprising:
   applying an adhesive film on an upper surface of a wafer;
   peeling the adhesive film away from the upper surface of the wafer by using a peeling tape;
   illuminating the peeling tape with first UV light after the peeling; and
   acquiring a fluorescence image from the peeling tape and/or illuminating the wafer with second UV light after the peeling; and
   acquiring a fluorescence image from the wafer,
   wherein the fluorescence image is acquired from the wafer after the peeling.

2. The method of claim 1, wherein the first UV light is directed towards a first side of the peeling tape, and wherein the first side of the peeling tape faces the wafer during the peeling.

3. The method of claim 2, further comprising:
   illuminating a second side of the peeling tape opposite the first side with first visible or IR backlight after the peeling; and
   acquiring a backlight image from the peeling tape.

4. The method of claim 3, wherein the fluorescence image from the peeling tape and the backlight image from the peeling tape are acquired with a same first camera having separate channels for fluorescence light from first UV light and first visible or IR backlight and/or using first UV light and first visible or IR backlight multiplexing.

5. The method of claim 1, further comprising:
   illuminating the wafer with a second visible or IR backlight after the peeling; and
   acquiring a backlight image from the wafer.

6. The method of claim 5, wherein the fluorescence image from the wafer and the backlight image from the wafer are acquired with a same second camera having separate channels for fluorescence light from second UV light and second visible or IR backlight and/or using second UV light and second visible or IR backlight multiplexing.

7. The method of claim 1, further comprising:
   illuminating the wafer with a frontlight in the visible or IR range before and/or after the peeling; and
   acquiring a frontlight image from the wafer.

8. The method of claim 1, further comprising:
   using the second UV light to illuminate a peeling chuck when no wafer is disposed thereon; and
   acquiring a fluorescence image from the peeling chuck.

9. The method of claim 1, further comprising:
   marking a section of the peeling tape with a label indicative of the particular wafer which was peeled with the corresponding section of the peeling tape.

10. The method of claim 1, wherein the method comprises acquiring the fluorescence image from the peeling tape, and wherein acquiring the fluorescence image from the peeling tape comprises generating the fluorescence image to depict a contrast between intact regions of the adhesive film that are present on the peeling tape and regions of the peeling tape that are devoid of the adhesive film.

11. The method of claim 1, wherein the adhesive film is applied such that the adhesive film completely covers the upper surface of the wafer.

12. An apparatus for detecting adhesive residue the apparatus comprising:
    a mechanism configured to apply an adhesive film on an upper surface of a wafer and to peel an adhesive film away from the upper surface of the wafer by using a peeling tape; and
    a first UV light source configured to illuminate the peeling tape that with first UV light after the peeling; and
    a first camera configured to acquire a fluorescence image from the peeling tape and/or a second UV light source configured to illuminate the wafer with second UV light after the peeling; and
    a second camera configured to acquire a fluorescence image from the wafer,
    wherein the second camera is configured to acquire the fluorescence image from the wafer with the second UV light after the peeling.

13. The apparatus of claim 12, wherein the first UV light source and the first camera are accommodated in a movable peeling unit configured to translate forward and backward across the wafer.

14. The apparatus of claim 12, wherein the first UV light source is configured to illuminate the peeling tape at a position on a peeling bar arranged adjacent to the wafer.

15. The apparatus of claim 12, wherein the first UV light source and the first camera are stationary relative to the peeling position of the wafer.

16. The apparatus of claim 12, wherein the first camera and/or the second camera is a line scan camera or an area scan camera.

17. The apparatus of claim 12, wherein the first UV light source and the first camera and/or the second UV light source and the second camera comprise an array of contact image sensors with integrated illumination.

18. The apparatus of claim 12, wherein the first camera is configured to acquire the fluorescence image from the peeling tape, and wherein the first camera is configured to acquire the fluorescence image by generating the fluorescence image to depict a contrast between intact regions of the adhesive film that are present on the peeling tape and regions of the peeling tape that are devoid of the adhesive film.

19. The apparatus of claim 12, wherein the mechanism is configured to apply the adhesive film such that the adhesive film completely covers the upper surface of the wafer.

\* \* \* \* \*

UNITED STATES PATENT AND TRADEMARK OFFICE
CERTIFICATE OF CORRECTION

| | |
|---|---|
| PATENT NO. | : 11,309,196 B2 |
| APPLICATION NO. | : 16/588433 |
| DATED | : April 19, 2022 |
| INVENTOR(S) | : R. Muhr et al. |

It is certified that error appears in the above-identified patent and that said Letters Patent is hereby corrected as shown below:

In the Claims

Column 16, Line 58 (Claim 12, Line 8) please change "tape that with" to -- tape with --

Signed and Sealed this
Twelfth Day of July, 2022

Katherine Kelly Vidal
*Director of the United States Patent and Trademark Office*